United States Patent
Gunadisastra

[11] Patent Number: 5,828,870
[45] Date of Patent: Oct. 27, 1998

[54] METHOD AND APPARATUS FOR CONTROLLING CLOCK SKEW IN AN INTEGRATED CIRCUIT

[75] Inventor: Peter Gunadisastra, Palo Alto, Calif.

[73] Assignee: Adaptec, Inc., Milpitas, Calif.

[21] Appl. No.: 884,863

[22] Filed: Jun. 30, 1997

[51] Int. Cl.$^6$ ................................................. G06F 1/12
[52] U.S. Cl. ............................................ 395/558; 395/552
[58] Field of Search ................................... 395/551, 552, 395/558, 750.03, 750.04, 750.06

[56] References Cited

U.S. PATENT DOCUMENTS

| | | | |
|---|---|---|---|
| 4,573,017 | 2/1986 | Levine | 327/114 |
| 5,083,266 | 1/1992 | Watanabe | 395/560 |
| 5,204,559 | 4/1993 | Deyhimy et al. | 327/232 |
| 5,258,660 | 11/1993 | Nelson et al. | 327/141 |
| 5,305,451 | 4/1994 | Chao et al. | 395/555 |
| 5,396,111 | 3/1995 | Frangioso et al. | 327/144 |
| 5,628,000 | 5/1997 | Kashiyama et al. | 395/558 |
| 5,742,798 | 4/1998 | Goldrian | 395/551 |
| 5,764,965 | 6/1998 | Poimboeuf et al. | 395/558 X |

FOREIGN PATENT DOCUMENTS

| | | |
|---|---|---|
| 0613074A1 | 8/1994 | European Pat. Off. . |
| 0624837A1 | 11/1994 | European Pat. Off. . |
| 2279473 | 1/1995 | United Kingdom . |

*Primary Examiner*—Thomas M. Heckler
*Attorney, Agent, or Firm*—Hickman & Martine, LLP

[57] ABSTRACT

A method for controlling clock skew in an integrated circuit which includes a plurality of functional blocks which each contain a control circuit that is in communication with a gated clock includes: a) providing a source clock signal to the control circuit, b) providing a reference clock signal to the control circuit, the reference clock signal being substantially derived from the source clock signal, wherein the reference clock signal has a reference clock phase delay that is greater a phase delay of the gated clock, c) generating a control signal using the reference clock signal and the gated clock, the control signal being arranged to indicate a relationship between the reference clock signal and the gated clock, and d) generating a controlled gated clock using the control signal, wherein the controlled gated clock is generated at least in part by adding a suitable delay to the source clock signal, the controlled gated clock having a controlled gated clock phase delay which is substantially the same as the reference clock phase delay. In some embodiments, the reference clock signal and the source clock signal are provided by a frequency synthesizer.

20 Claims, 5 Drawing Sheets

METHOD AND APPARATUS FOR CONTROLLING CLOCK SKEW IN AN INTEGRATED CIRCUIT

TECHNICAL FIELD

This invention relates generally to the operation of integrated circuits, and more particularly methods and apparatus for controlling clock skew between different functional blocks of an integrated circuit.

BACKGROUND ART

As integrated circuit technology advances, the number of functional blocks, or modules, which can be placed within an integrated circuit is increasing. In general, not all functional blocks of an integrated circuit are in operation at any particular time. Allowing all functional blocks of an integrated circuit to remain powered up at all times, regardless of whether all functional blocks are in operation, can be an inefficient use of the power provided to the integrated circuit. In order to reduce the power consumption of an integrated circuit, therefore, the power to each non-operating functional block which is not in use can be "shut off," or powered down. When a particular functional block which is shut down is needed, that functional block can then be powered up.

Each functional block within an integrated circuit generally includes a clock. In order to individually control the power provided to each of the functional blocks of an integrated circuit, power to the clocks associated with the functional blocks is typically controlled. Controls can be added to the clocks to enable the power to the clocks to be shut off and turned on as necessary. Power to each functional block is generally controlled by gating the clock in that functional block.

FIG. 1a is a diagrammatic representation of an integrated circuit 10 which includes functional blocks 12, 14, 16, that each have a gated clock 18, 20, 22, respectively. In order to shut off power to functional block 12, the gated clock 18 is shut off. Similarly, to shut off power to functional block 14, the gated clock 20 is shut off, and to shut off power to functional block 16, the gated clock 22 is shut off.

It should be appreciated that clock loading, or phase delays, associated with gated clocks 18, 20, 22 can be widely varied, since each gated clock 18, 20, 22 can have a different clock loading. As such, clock skew, or asynchronicity, between gated clocks 18, 20, 22 is often present. That is, gated clocks 18, 20, 22, generally operate in a substantially asynchronous manner.

When data transfer between functional block 12 and functional block 14 is necessary, for example, the asynchronous operation of gated clocks 18, 20 is often undesirable. Data transfer between functional block 12 and functional block 14 typically involves transferring data through flip-flops, such as flip-flop 24 which is associated with functional block 12, and flip-flop 26 which is associated with functional block 14. The operation of flip-flops 24, 26 is dependent upon clock signals received from gated clocks 18, 20, respectively, through clock trees 28, 30, respectively. As such, in order to ensure the integrity of data passed between flip-flops 24 and 26, the clock skew between gated clocks 18 and 20 of functional blocks 12 and 14, respectively, must not exceed the propagation time of the faster of flip-flops 24 and 26, as will be appreciated by those skilled in the art. Therefore, it is desirable to minimize clock skew between functional blocks 12, 14, 16.

In order to minimize clock skew between functional blocks 12, 14, 16, the clock loading of each functional block 12, 14, 16 can be calculated by the designer of integrated circuit chip 10. Once the clock loadings are calculated for each functional block 12, 14, 16, the delays in clock trees 28, 30, 31 associated with flip-flops 24, 26, 27, respectively, can be manually adjusted in order to minimize clock skew between functional blocks 12, 14, 16. In general, clock trees 28, 30, 31 are used to propagate clock signals within functional blocks 12, 14, 16, respectively.

Due to variations in clock loading, accurately "lining up" or synchronizing gated clocks 18, 20, 22 can be both time-consuming and difficult. Variations in clock loading can be caused by any number of different factors including, but not limited to, process variations associated with fabricating integrated circuit 10, and temperature variations during the operation of integrated circuit 10. Since such variations in clock loading can be difficult to anticipate, manually adjusting delays within clock trees 28, 30, 31 to account for the variations can, even after many design iterations, still prove to be inaccurate.

Since manually adjusting, or tuning, delays in clock trees to minimize clock skew between the functional blocks of an integrated circuit can be time-consuming and inaccurate, frequency synthesizers are often added to integrated circuits in an effort to automatically minimize clock skew. Figure 1b is a diagrammatic representation of an integrated circuit chip 50 which includes functional blocks 52, 54, 56 that have respective gated clocks 60, 62, 64 and associated frequency synthesizers 66, 68, 70. The clock frequency and clock skew associated with functional blocks 52, 54, 56 is controlled by frequency synthesizers 66, 68, 70, respectively. That is, the frequency associated with components in functional blocks 52, 54, 56 is controlled by frequency synthesizers 66, 68, 70, respectively. By way of example, frequency synthesizer 66, which is coupled to gated clock 60 of functional block 52, is used to minimize clock skew between functional blocks 52, 54, 56 by automatically lining up gated clock 60 with respect to gated clocks 62, 64. Likewise, frequency synthesizer 68 is coupled to gated clock 62 of functional block 54, and frequency synthesizer 70 is coupled to gated clock 64 of functional block 56, also to serve the purpose of minimizing clock skew functional blocks 52, 54, 56. Lining up gated clocks 60, 62, 64 using frequency synthesizers 66, 68, 70 is possible due to the fact that frequency synthesizers 66, 68, 70 have the same reference clock 74.

While the use of individual frequency synthesizers 66, 68, 70 for respective functional blocks 52, 54, 56 is effective to minimize clock skew between functional blocks 52, 54, 56, frequency synthesizers 66, 68, 70 are generally analog modules which require a relatively large amount of space on integrated circuit 50. For example, frequency synthesizers 66, 68, 70 require analog circuitry, including voltage control oscillators, as well as dedicated power circuitry, i.e. analog grounds and analog voltages, for operation. Since frequency synthesizers 66, 68, 70, as well as dedicated power circuitry, require a relatively large area on integrated circuit 50, the use of individual frequency synthesizers 66, 68, 70 for each functional block 52, 54, 56 respectively, can be expensive in terms of the amount of silicon needed on integrated circuit 50 to accommodate frequency synthesizers 66, 68, 70 and dedicated circuitry.

Therefore, what is desired are inexpensive, efficient methods and apparatus for controlling clock skew between functional blocks in an integrated circuit. In particular, what is desired are methods and apparatus for automatically controlling clock skew without requiring the addition of a relatively large amount of dedicated circuitry on an integrated circuit.

DISCLOSURE OF THE INVENTION

A method for minimizing clock skew between functional blocks of an integrated circuit involves implementing a self-tuning clock skew control loop. The self-tuning clock skew control loop enables clock skew between functional blocks of the integrated circuit to be automatically reduced through the use of a single frequency synthesizer. Using only a single frequency synthesizer in cooperation with clock skew control loops to automatically line up gated clocks in an integrated circuit saves space on the integrated circuit, and also improves the efficiency of the operation of the integrated circuit.

A method for controlling clock skew in an integrated circuit which includes a plurality of functional blocks which each contain a control circuit that is in communication with a gated clock includes: a) providing a source clock signal to the control circuit, b) providing a reference clock signal to the control circuit, the reference clock signal being substantially derived from the source clock signal, wherein the reference clock signal has a reference clock phase delay that is greater a phase delay of the gated clock, c) generating a control signal using the reference clock signal and the gated clock, the control signal being arranged to indicate a relationship between the reference clock signal and the gated clock, and d) generating a controlled gated clock using the control signal, wherein the controlled gated clock is generated at least in part by adding a suitable delay to the source clock signal, the controlled gated clock having a controlled gated clock phase delay which is substantially the same as the reference clock phase delay. In some embodiments, the reference clock signal is provided by a frequency synthesizer which also provides the source clock signal. In such embodiments, the reference clock signal is generated substantially by delaying the source clock signal.

A self-tuning clock skew control circuit in a selected functional block of an integrated circuit which includes a plurality of functional blocks and a frequency synthesizer that is arranged to generate a source clock signal and a reference clock signal includes: a) a phase detector circuit coupled to the frequency synthesizer, the phase detector circuit being arranged to compare the reference clock signal to a gated clock signal, the phase detector further being arranged to generate a phase detector output signal that indicates a relationship between the reference clock signal and the gated clock signal, b) a filter circuit coupled to the phase detector circuit, the filter circuit being arranged to process the phase detector output signal to generate a control signal, and c) a delay circuit coupled to the filter circuit, the delay circuit being arranged to use the control signal to generate a desired delay for a controlled gated clock signal, wherein the controlled gated clock signal is generated by adding the desired delay to the source clock signal, the controlled gated clock signal being substantially the same for each of the plurality of functional blocks. In some embodiments, the reference clock signal has a reference clock signal delay which is greater than a gated clock delay.

Providing only a single frequency synthesizer in cooperation with clock skew control loops to automatically line up gated clocks is more efficient than providing a single frequency synthesizer for each gated clock, as frequency synthesizers are typically analog, and require a significant amount of space on the surface of an integrated circuit. Using a single frequency synthesizer and multiple clock skew control loops, therefore, saves area on an integrated circuit, and also improves the operation of the integrated circuit..

These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings in which.

BEST MODES FOR CARRYING OUT THE INVENTION

Figure 1A:
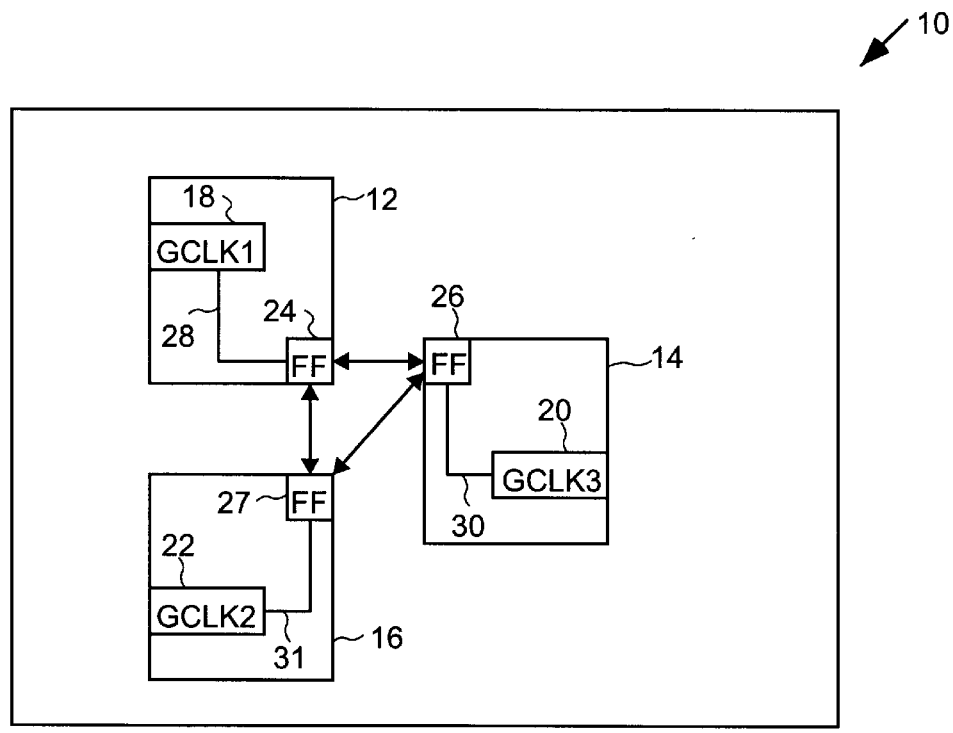
FIG. 1a is a diagrammatic representation of an integrated circuit which includes gated clocks in accordance with prior art.
Figure 1B:
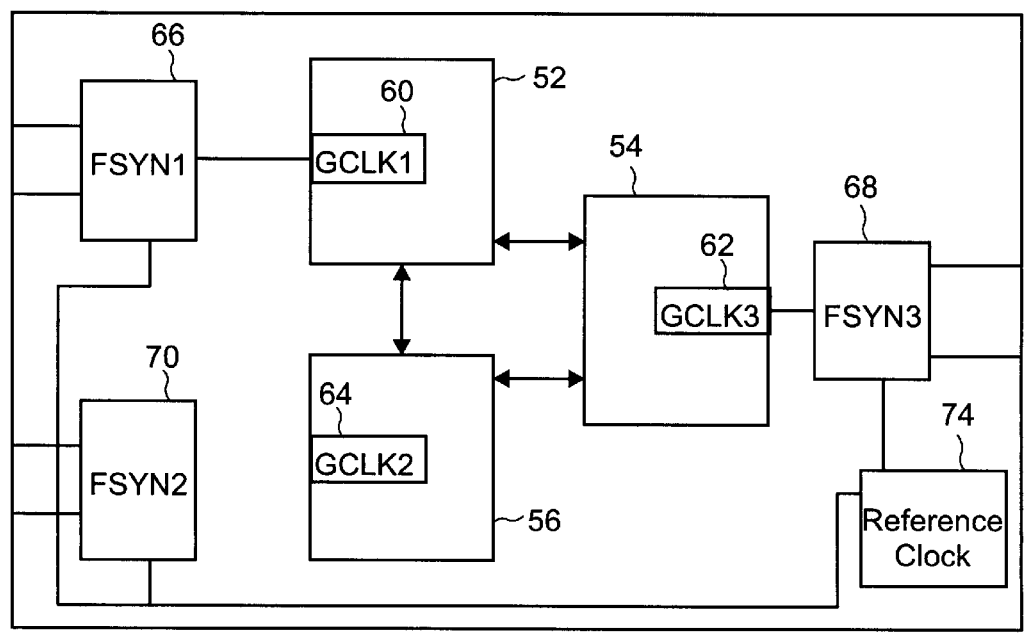
FIG. 1b is a diagrammatic representation of an integrated circuit which includes gated clocks and frequency synthesizers in accordance with prior art.
Figure 2:
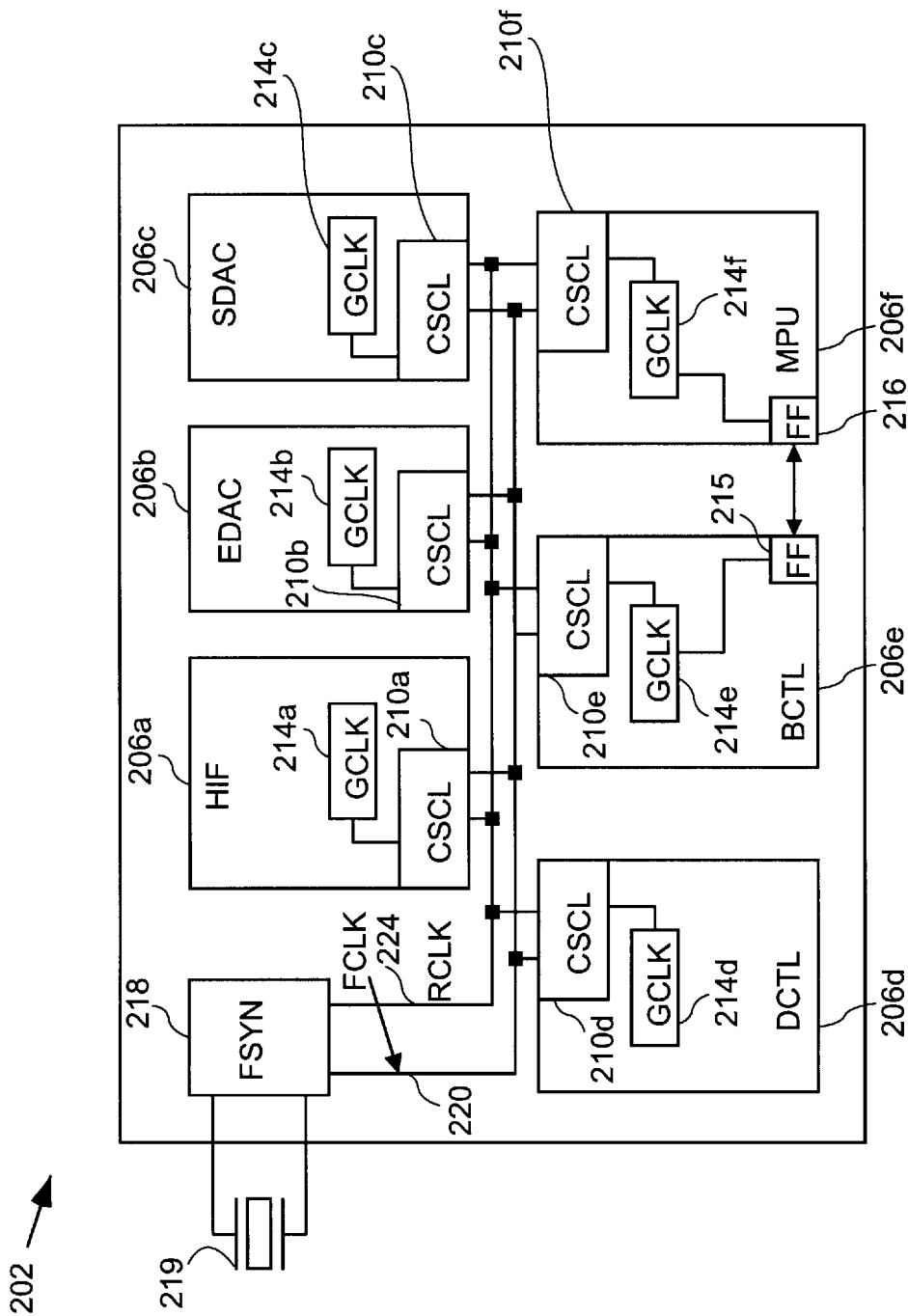
FIG. 2 is a diagrammatic representation of an integrated circuit which includes self-tuning clock skew control loops in accordance with an embodiment of the present invention.

FIG. 1a and 1b are diagrammatic representations of prior art integrated circuits which includes gated clocks, and were discussed previously. FIG. 2 is a diagrammatic representation of an integrated circuit which includes self-tuning clock skew control loops in accordance with an embodiment of the present invention. An integrated circuit chip 202 includes functional blocks 206a–f. Although integrated circuit 202 can be any suitable integrated circuit, in the described embodiment, integrated circuit 202 is a controller for a CD-ROM drive. As such, functional block 206a is a host block, functional block 206b is an EDAC block for error control coding, and functional block 206c is an SDAC block for error control coding. Further, functional block 206d is a disk controller, functional block 206e is a buffer controller, and functional block 206f is a microprocessor. It should be appreciated, however, that functional blocks 206a–f can generally be any suitable functional blocks.

Each functional block 206a–f includes a self-tuning clock-skew control loop (CSCL) 210a–f. Each CSCL 210a–f is used to control a gated clock (GCLK) 214a–f to minimize the amount of clock skew between functional blocks 206a–f. In other words, each CSCL 210a–f is used to reduce the clock skew and, hence, the asynchronous operation of GCLK 214a–f. In order to reduce the amount of clock skew associated with functional blocks 206a–f, CSCL 210a–f is arranged to automatically tune GCLK 214a–f, respectively, in response to process variations associated with the fabrication of integrated circuit 202, as well as in response to temperature variations which often arise during the operation of integrated circuit 202. One particularly suitable configuration of CSCL 210a–f will be described below with respect to FIG. 3.

Minimizing the clock skew between functional blocks 206a–f tuning GCLK 214a–f enables the integrity of data that is transferred between functional blocks 206a–f to be preserved, as GCLK 214a–f are substantially synchronized. For data can be accurately transferred between functional blocks 206e and 206f via a flip-flop 215 of functional block 206e and a flip-flop 216 of functional block 206f, when the clock skew between functional blocks 206e and 206f is minimized, or otherwise does not exceed the propagation time of the faster of flip-flops 215 and 216. Minimizing the clock skew between functional blocks 206e and 206f promotes the substantially synchronous operation of flip-flops 215 and 216, thereby allowing the integrity of data that is transferred through flip-flops 214 and 216 to be preserved.

A single frequency synthesizer (FSYN) 218, which is coupled to a crystal 219, provides a frequency stable clock (FCLK) 220 which is coupled to each CSCL 210a–f. FSYN 218 also provides a reference clock (RCLK) 224 as an input to each CSCL 210a–f. RCLK 224 is essentially a delayed version of FCLK 220, i.e., RCLK 224 has a phase delay with respect to FCLK 220. Further, each GCLK 214a–f has an associated phase delay with respect to RCLK 220. Generally, the phase delay of each GCLK 214a–f will be different. Hence, the clock skew between different GCLK 214a–f typically varies.

In one embodiment, the phase delay of RCLK 224 is larger than the phase delay of every GCLK 214a–f. That is, the phase delay of RCLK 224 is larger than the largest phase delay of any GCLK 214a–f. By providing RCLK 224 with a larger phase delay than GCLK 214a–f, each CSCL 210a–f can delay an associated GCLK 214a–f in order to substantially match the phase of RCLK 220. Although phase delays can be widely varied, typical phase delays for RCLK 224 are approximately 5 nanoseconds, while typical phase delays for GCLK 214a–f, prior to being delayed by CSCL 210a, are in the range of approximately 1.5 nanoseconds to approximately 4.5 nanoseconds with respect to RCLK 224.

In general, CSCL 210a–f is arranged to use FCLK 220 and RCLK 224 in order to automatically tune GCLK 214a–f in response to factors such as process variations integrated circuit 202, as well as temperature variations which can arise during the operation of integrated circuit 202. FCLK 220, RCLK 224, and GCLK 214a–f are, in essence, compared using CSCL 210a–f, which further dynamically adjusts GCLK 214a–f to minimize clock skew.

Figure 3:
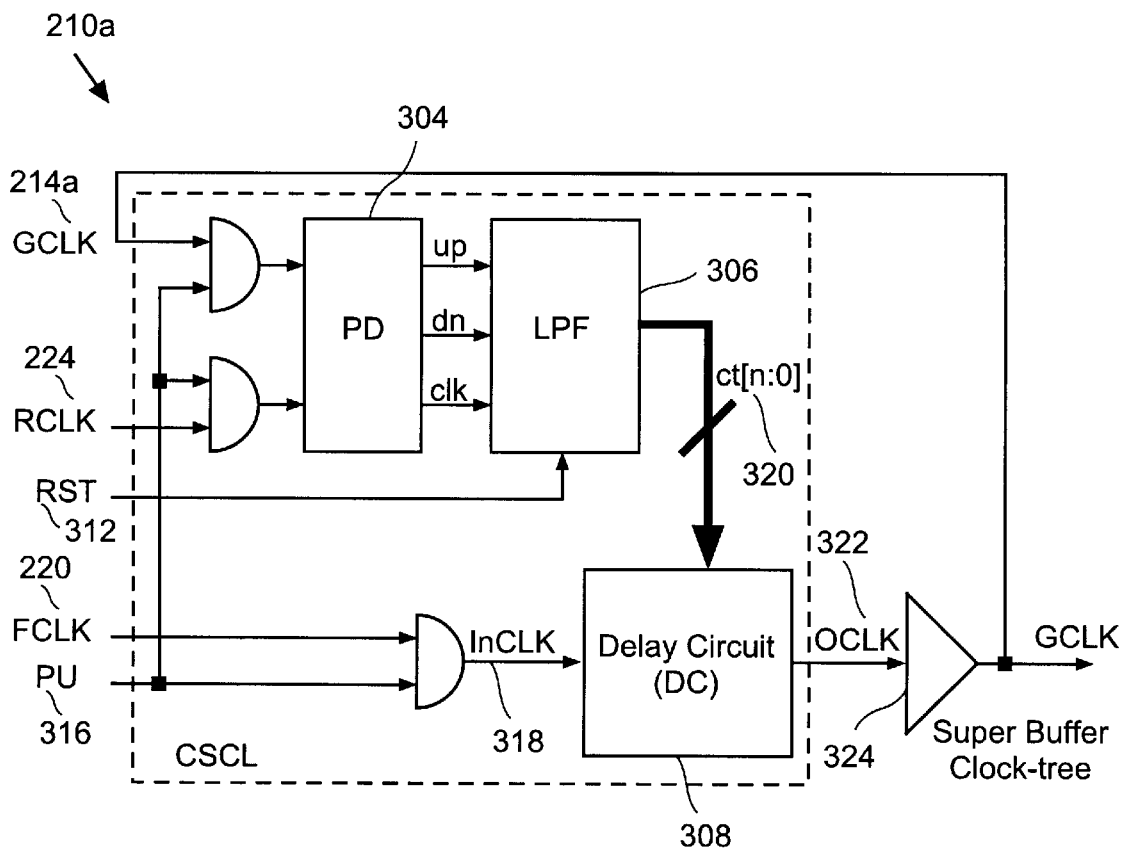
FIG. 3 is a block diagram which illustrates a self-tuning clock skew control loop in accordance with an embodiment of the present invention.

FIG. 3 is a block diagram which illustrates a self-tuning clock skew control loop in accordance with an embodiment of the present invention. In other words, FIG. 3 is one embodiment of a block diagram for CSCL 210a of FIG. 2. It should be appreciated that the block diagram for CSCL 210a generally represents any of CSCL 210a–f. CSCL 210a includes a phase detector (PD) 304, a digital low pass filter (DLPF) 306, and a delay circuit (DC) 308. PD 304, which compares differences between clocks to limit the clock skew of an associated functional block, will be described below with respect to FIG. 4. DC 308 generally includes delay elements which are arranged to further limit the clock skew in an associated functional block, and can be implemented as either a digital circuit or as an analog circuit. A digital implementation of DC 308 will be discussed below with reference to FIG. 5, while an analog implementation of DC 308 will be discussed below with reference to FIG. 6.

DLPF 306 is arranged to add stability to CSCL 210a by providing feedback within CSCL 210a that is less than unity. In general, DLPF 306 achieves stability in CSCL 210a by ensuring that the sensitivity of PD 304 is less than the delay of delay elements associated with DC 308. In one embodiment, DLPF 306 performs an integration operation using inputs provided from PD 304, and produces an output signal, in the form of a control word 320, as an input to DC 308. DLPF 306 can include a built-in memory, in addition to any suitable up-down counter which controls switches via a decoder to activate and deactivate delay elements within DC 308.

The inputs to CSCL 210a generally include GCLK 214a, RCLK 224, and FCLK 220. The inputs further include a reset (RST) 312 which is used to reset DLPF 306, and a power up (PU) 316 which is a power enable that is used to enable and disable GCLK 214a output. PU 316 also controls signals, e.g., GCLK 214a and RCLK 224, into PD 304, as well as input into DC 308. For example, PU 316 controls an input clock (InClk) 318 into DC 308 by enabling FCLK 220.

An output clock (OCLK) 322 that is produced by CSCL 210a or, more particularly, DC 308, is provided as an input to a buffer 324. In one embodiment, buffer 324 is a part of a buffer clock tree which is arranged to provide GCLK 214a such that GCLK 214a is capable of driving nets within the associated functional block, i.e., functional block 206a of FIG. 2, of which CSCL 210a is a part.

Figure 4:
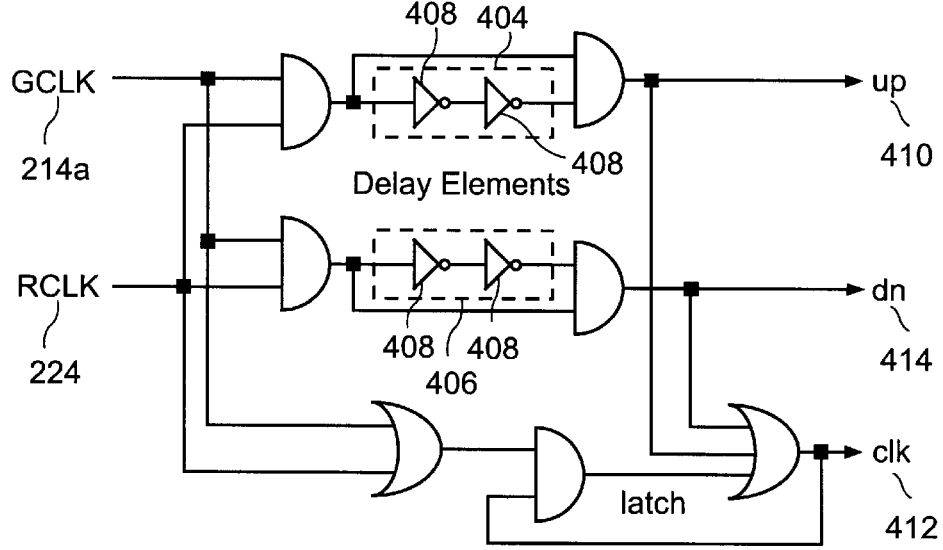
FIG. 4 is a block diagram which illustrates a phase detector in accordance with an embodiment of the present invention.

With reference to FIG. 4, a block diagram which illustrates a phase detector, e.g., PD 304 of FIG. 3, will be described in accordance with an embodiment of the present invention. PD 304 is typically configured such that the sensitivity of PD 304 is less than the maximum delay element delay time associated with a delay circuit that is in communication with PD 304. To insure that the sensitivity of PD 304 is acceptable, delay elements 404,406 are included in PD 304. Delay elements 404,406 include inverters 408, and are further arranged to stabilize the CSCL.

PD 304 is arranged to compare GCLK 214a and RCLK 224. When PD 304 compares GCLK 214a and RCLK 224 and determines that GCLK 214a leads RCLK 224, an "up" signal (up) 410 is generated in addition to a clock pulse (clk) 412. In one embodiment, both up 410 and clk 412, which provides the magnitude of the lead GCLK 214a has with respect to RCLK 224, are then provided as inputs to a low-pass filter, as for example DLPF 306 of FIG. 3. If the comparison between GCLK 214a and RCLK 224 shows that GCLK 214a lags RCLK 224, then a "down" signal (dn) 414 is produced in addition to clk 412, which provides the magnitude of the lag GCLK 214a has with respect to RCLK 224. Both dn 414 and clk 412 can then be used as inputs to a low-pass filter.

Figure 5:
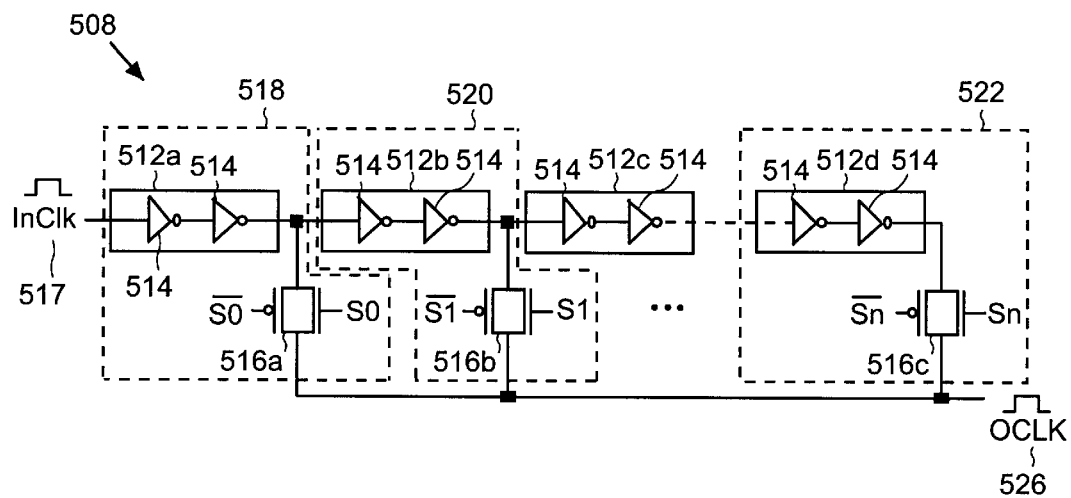
FIG. 5 is a block diagram which illustrates a digital delay circuit in accordance with an embodiment of the present invention.

FIG. 5 is a block diagram which illustrates a digital implementation of a delay circuit, i.e., a digital implementation of DC 308 of FIG. 3, in accordance with an embodiment of the present invention. A digital delay circuit 508, as previously mentioned, includes delay elements 512a–d which are basically arranged to add time delays to a GCLK signal such that the GCLK signal is substantially in phase with an associated RCLK signal. Digital delay circuit 508, in one embodiment, is an inverter chain delay circuit that includes inverter components, 512a–d. The number of inverters 514 in inverter components 512a–d, as well as the speed of each inverter 514, typically depends upon the time delays desired within digital delay circuit 508. Although an inverter component, as for example inverter component 512a, can generally include any number of inverters 514, in one embodiment, inverter component 512a includes two inverters 514. The use of two inverters 514 within each inverter component 512a–d enables the polarity for each delay to remain the same, and further ensures that the selection of the delay is made between two points which are at substantially the same polarity.

Transmission gates 516a–c are arranged to be turned on and off using a control word provided by a low pass filter, e.g., the output signal provided by DLPF 306 of FIG. 3. The control word, or signal, provided by the low pass filter is typically decoded in order to turn on the appropriate transmission gate 516 for a desired delay. Within digital delay circuit 508, transmission gates 516 are arranged such that only one transmission gate 516 can be turned on at any given time.

An input clock (InClk) 517 which, in one embodiment, is a frequency stable clock, passes through first delay element 518. First delay element 518 includes inverter component 512a and transmission gate 516a. Similarly, a second delay element 520 includes inverter component 512b and transmission gate 516b. An n-th delay element 522 includes inverter component 512d and transmission gate 516c, where "n" corresponds to the number of delay elements needed for a particular application. In general, the number of delay elements "n" needed for a particular application depends upon the desired range of overall delays, as well as the individual delays associated with each delay element, e.g., delay element 518. In one embodiment, the overall delays range from approximately 0.1 nanoseconds to approximately five nanoseconds, as for example approximately two nanoseconds, although it should be appreciated that the overall delays can be much higher. It should be appreciated that the range of overall delays typically reflects the range of clock skews in different functional blocks of an integrated circuit. The individual delays associated with delay element 518, for example, generally range from approximately 0.1 nanoseconds to approximately one nanosecond. Accordingly, if each delay element has a delay of approximately 0.1 nanoseconds, then to achieve a maximum delay of approximately five nanoseconds, the number of delay elements "n" is approximately fifty.

For an embodiment in which digital delay circuit 508 includes delay elements with delays of approximately 0.1 nanoseconds, and the number of delay elements "n" is approximately twenty, i.e., when the maximum delay associated with digital delay circuit 508 is approximately two nanoseconds, turning on transmission gate 516a provides an output signal (OCLK) 526 which is delayed by approximately 0.1 nanoseconds from InClk 517. Turning on transmission gate 516b, on the other hand, results in OCLK 526 being delayed by approximately 0.2 nanoseconds from InClk 517. Finally, in order to achieve a maximum delay of approximately two nanoseconds in OCLK 526, transmission gate 516c can be turned on while keeping other transmission gates turned off.

Figure 6:
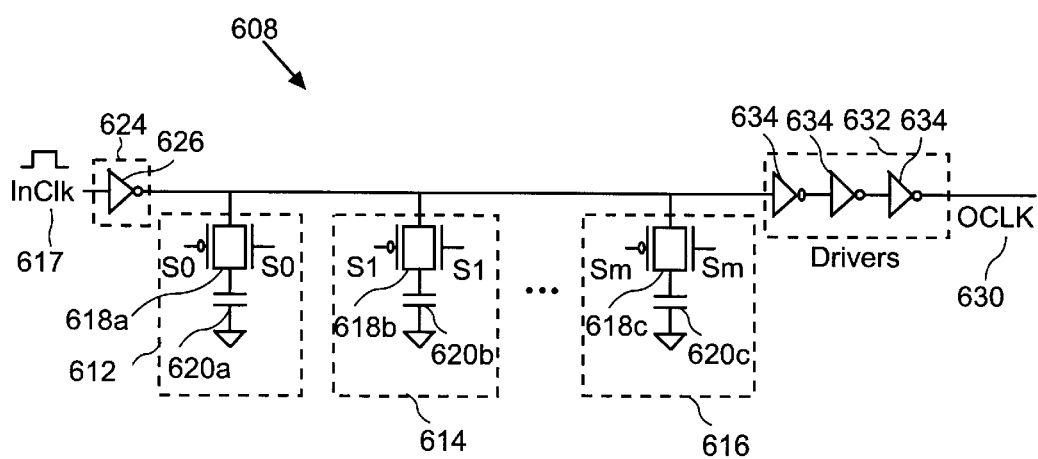
FIG. 6 is a block diagram which illustrates an analog delay circuit in accordance with an embodiment of the present invention.

The use of digital delay circuit 508 typically does not enable the granularity of individual delays to be much less than approximately 0.1 nanoseconds. In order to implement smaller individual delays, or delay increments, an analog delay circuit can be used. FIG. 6 is a block diagram which illustrates an analog implementation of a delay circuit i.e., DC 308 of FIG. 3, in accordance with an embodiment of the present invention. An analog delay circuit 608 can be an RC delay circuit which includes any number of delay elements, including delay elements 612, 614, 616. The number of delay elements "m" in analog delay circuit 608 is generally dependent upon the maximum delay desired in analog delay circuit 608, as well as the individual delays associated with the delay elements. In one embodiment, delay element 612 includes a transmission gate 618a and a capacitor 620a. Similarly, delay element 614 includes a transmission gate 618b and a capacitor 620b, while delay element 616, which is the m-th delay element, also includes a transmission gate 618c and a capacitor 620c.

It should be appreciated that the time delay associated with each delay element 612, 614, 616 can be widely varied. Individual delays associated with each delay element 612, 614, 616, typically range from approximately 10 picoseconds to approximately 100 picoseconds, as for example approximately 20 picoseconds. The maximum overall delay associated with analog delay circuit 608 is typically less than approximately one nanosecond, although it should be appreciated that the maximum overall delay can be varied. In general, in order to achieve a maximum overall delay of more than approximately one nanosecond, a digital delay circuit is used in lieu of analog delay circuit 608.

As previously mentioned, the number of delay elements "m" in analog delay circuit 608 depends on both the magnitude of the individual delays and the desired maximum overall delay. By way of example, if the individual delay for each delay element 612, 614, 616 is approximately 0.05 nanoseconds, in order to enable a maximum overall delay of approximately one nanosecond to be achieved using analog delay circuit 608, the number of delay elements "m" is approximately twenty. As such, delay element 616 corresponds to the twentieth delay element associated with analog delay circuit 608.

An input clock (InClk) 617 passes through inverter component 624 which, in one embodiment, includes a single inverter 626, although any number of inverters 626 can be used. A control signal, or word, from a digital low-pass filter, e.g., DLPF 306 of FIG. 3, is arranged to turn on one or more transmission gates 618a–c at any given time. Specifically, the control signal is decoded to turn on transmission gates 618a–c sequentially, as needed. The number of transmissions gates 618a–c which are turned on determines the delay that is added to InClk 617 to facilitate the production of an acceptable output signal (OCLK) 630. For example, if individual delays are approximately 100 picoseconds, in order to delay InClk 617 by approximately 100 picoseconds, only transmission gate 618a is turned on. To delay InClk 617 by approximately 200 picoseconds, both transmission gate 618a and transmission gate 618b are turned on, as the delays associated with delay elements 612, 614 are additive. It should be appreciated that simply turning on only transmission gate 618b will delay InClk 617 by approximately 100 picoseconds. A driver arrangement 632 is provided to reduce the rise-time delay and the fall-time associated with analog delay circuit 608, as will be appreciated by those skilled in the art.

In general, it should be appreciated that the start-up time of a CSCL in a functional block, in response to an initial application of power to the functional block, is dependent at least in part upon the number of delay elements associated with the CSCL. As such, as the number of delay elements associated with a CSCL increases, the start-up time of the CSCL also increases. Therefore, since the number of delay elements associated with a CSCL can be varied, as discussed above, start-up times at initial power up for a CSCL can also be varied. It should be appreciated that the start-up time is typically only evident when a functional block is powered up for a first time, due to the fact that a DLPF within CSCL often includes a built-in memory. When the gated clock is turned on the second or subsequent time, the built-in memory in the DLPF selects the previous delay; therefore, no start-up time is typically needed.

Figure 7:
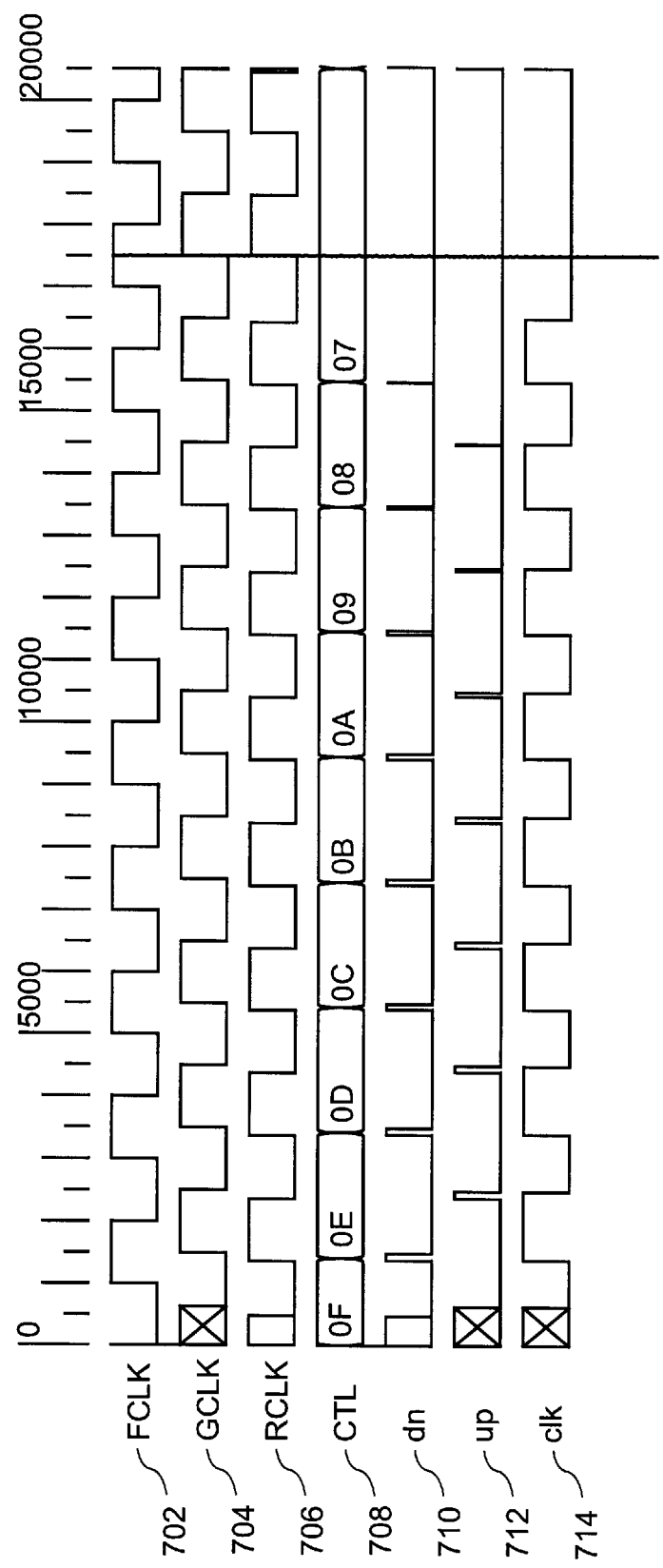
FIG. 7 is a timing diagram which associated with a self-tuning clock-skew control loop in accordance with an embodiment of the present invention.

FIG. 7 is a timing diagram which illustrates the effects of using the CSCL in accordance with an embodiment of the present invention. As shown, FCLK 702, GCLK 704, and RCLK 706 all have substantially the same pulse width, e.g., period. However, GCLK 704 and RCLK 706 lag FCLK 702. CTL 708, which is provided to a delay circuit, as for example DC 308 of FIG. 3, enables GCLK 704 to be substantially synchronized with RCLK 706. Specifically, a phase detector, e.g., PD 304 of FIG. 3, uses GCLK 704 and RCLK 706 to generate signals dn 710, up 712, and clk 714. Signals dn 710, up 712, and clk 714 are then provided to a filter to generate CTL 708.

Although only a few embodiments of the present invention have been described, it should be understood that the present invention can be embodied in many other specific forms without departing from the spirit or the scope of the present invention. By way of example, both the number of functional blocks and the type of functional blocks within an integrated circuit can be widely varied. As such, the range of delays which are desired within a clock skew control loop can be expanded, or the granularity associated with the delays can be modified. Accordingly, the number of transmission gates as well as the configuration of any inverters within a delay circuit can be widely varied without departing from the spirit or the scope of the present invention.

The actual configuration of delay circuits can also vary. By way of example, in a digital delay circuit which is arranged as an inverter chain delay circuit, capacitors can be placed at the output of at least some of the inverters to produce longer delays in associated delay elements. Such capacitors can also serve to compensate for process variations in the fabrication of integrated circuits which use the digital delay circuit.

Further, the overall arrangement of the self-tuning clock skew control circuit can vary. For example, the phase detector can be implemented with substantially only a set of simple gates, e.g., XOR gates. In addition, although the digital low pass filter has been described as being an up-down counter, the digital low pass filter can include any suitable circuitry which performs an integration operation without departing from the spirit or the scope of the present invention. Therefore, the described embodiments should be taken as illustrative and not restrictive, and the invention should be defined by the following claims and their full scope of equivalents.

What is claimed is:

1. A method for controlling clock skew in an integrated circuit, the integrated circuit including a plurality of functional blocks, each of the functional blocks including a control circuit in communication with a gated clock which generates a gated clock signal, the gated clock signal having a gated clock phase delay, the method comprising:
   a) providing a source clock signal to a control circuit associated with a functional block selected from the plurality of functional blocks;
   b) providing a reference clock signal to the control circuit, the reference clock signal being substantially derived from the source clock signal, wherein the reference clock signal has a reference clock phase delay that is greater than the gated clock phase delay;
   c) generating a control signal using the reference clock signal and the gated clock signal, the control signal being arranged to indicate a relationship between the reference clock signal and the gated clock signal; and
   d) generating a controlled gated clock signal using the control signal, wherein the controlled gated clock signal is generated at least in part by adding a suitable delay to the source clock signal, the controlled gated clock signal having a controlled gated clock phase delay which is substantially the same as the reference clock phase delay.

2. A method as recited in claim 1 wherein the reference clock signal is provided by a frequency synthesizer, the frequency synthesizer further providing the source clock signal, the reference clock signal being generated substantially by delaying the source clock signal.

3. A method as recited in claim 1 wherein the control circuit includes a phase detector circuit, a filter circuit, and a delay circuit, the control signal being generated using the phase detector circuit and the filter circuit.

4. A method as recited in claim 3 wherein adding the suitable delay to the source clock signal includes:
   determining the suitable delay using the delay circuit, wherein the suitable delay is determined by activating a transmission gate associated with the delay circuit using the control signal.

5. A method as recited in claim 1 further including:
   e) repeating steps a)–d) for a first functional block; and
   f) repeating steps a)–d) for a second functional block.

6. A method as recited in claim 5 wherein the controlled gated clock signal for the first functional block and the controlled gated clock signal for the second functional block are substantially synchronous, the method further including:
   transferring data between the first functional block and the second functional block, wherein the transfer of data is facilitated by the controlled gated clock signal for the first functional block and the controlled gated clock signal for the second functional block.

7. A method as recited in claim 6 further including:
   passing the controlled gated clock signal for the first functional block through a first buffer to enable the controlled gated clock signal for the first functional block to drive a net associated with the first functional block; and
   passing the controlled gated clock signal for the second functional block through a second buffer to enable the controlled gated clock signal for the second functional block to drive a net associated with the second functional block.

8. A method for updating a gated clock in an integrated circuit comprising:
   providing a control circuit in the integrated circuit, the control circuit being in communication with the gated clock;
   providing a stable clock to the control circuit;
   providing a reference clock to the control circuit, the reference clock being at least partially derived from the stable clock, wherein the reference clock has a reference clock phase delay and the gated clock has a gated clock phase delay with respect to the stable clock;
   generating a control signal using the reference clock and the gated clock, the control signal being arranged to indicate a relationship between the reference clock and the gated clock;
   using the control signal to determine a delay, the delay being arranged to indicate a relationship between the gated clock and the stable clock; and
   modifying the gated clock using the delay.

9. A method as recited in claim 8 wherein the reference clock and the stable clock are provided by a frequency synthesizer, the reference clock being generated substantially by delaying the stable clock.

10. A method as recited in claim 8 wherein using the control signal to determine the delay includes using the control signal to activate a transmission gate in a delay circuit, whereby activating the transmission gate determines the delay.

11. A method as recited in claim 8 wherein generating the control signal includes:

detecting a phase delay between the reference clock and the gated clock; and processing the phase delay to generate the control signal.

12. A self-tuning clock skew control circuit in a selected functional block of an integrated circuit, the integrated circuit including a plurality of functional blocks and a frequency synthesizer arranged to generate a source clock signal and a reference clock signal for use by the plurality of functional blocks, the selected functional block including a gated clock in communication with the control circuit, the gated clock being arranged to generate a gated clock signal, the control circuit comprising:

a phase detector circuit coupled to the frequency synthesizer, the phase detector circuit being arranged to compare the reference clock signal to the gated clock signal, the phase detector further being arranged to generate a phase detector output signal that indicates a relationship between the reference clock signal and the gated clock signal;

a filter circuit coupled to the phase detector circuit, the filter circuit being arranged to process the phase detector output signal to generate a control signal; and a delay circuit coupled to the filter circuit, the delay circuit being arranged to use the control signal to generate a desired delay for a controlled gated clock signal, wherein the controlled gated clock signal is generated by adding the desired delay to the source clock signal, the controlled gated clock signal being substantially the same for each of the plurality of functional blocks.

13. A self-tuning clock skew control circuit as recited in claim 12 wherein the reference clock signal has a reference clock signal delay which is greater than a gated clock signal delay that is associated with the gated clock signal.

14. A self-tuning clock skew control circuit as recited in claim 13 wherein the phase detector circuit includes an arrangement of gates suitable for use in determining whether the gated clock signal leads the reference clock signal.

15. A self-tuning clock skew control circuit as recited in claim 14 wherein the phase detector circuit further includes:

at least one delay element arranged to stabilize the clock skew control circuit.

16. A self-tuning clock skew control circuit as recited in claim 13 wherein the filter circuit includes an up-down counter arranged to associate the phase detector output signal with the control signal.

17. A self-tuning clock skew control circuit as recited in claim 13 wherein the delay circuit is a digital circuit, the delay circuit including:

at least one inverter chain, each inverter chain having at least one inverter associated with a transmission gate, wherein the control signal is arranged to activate the transmission gate to generate the desired delay.

18. A self-tuning clock skew control circuit as recited in claim 17 wherein the desired delay is in the range of approximately 0.1 nanoseconds to approximately 5 nanoseconds.

19. A self-tuning clock skew control circuit as recited in claim 13 wherein the delay circuit is an analog circuit, the delay circuit including:

a plurality of transmission gates, wherein the control signal is arranged to activate at least one of the plurality of transmission gates to generate the desired delay.

20. A self-tuning clock skew control circuit as recited in claim 19 wherein the desired delay is in the range of approximately 0.1 nanoseconds to approximately 1 nanosecond.

* * * * *